United States Patent [19]

Davy

[11] 4,330,753

[45] May 18, 1982

[54] METHOD AND APPARATUS FOR RECOVERING A SIGNAL FROM A CHARGE TRANSFER DEVICE

[75] Inventor: L. Nevil Davy, Rochester, N.Y.

[73] Assignee: Eastman Kodak Company, Rochester, N.Y.

[21] Appl. No.: 156,293

[22] Filed: Jun. 4, 1980

[51] Int. Cl.³ ............................................. H03K 9/02
[52] U.S. Cl. ................................... 329/50; 307/238.2; 307/238.5; 329/109; 365/183; 365/206
[58] Field of Search .................... 329/50, 109, 102; 375/24, 94; 307/221 R, 221 C, 238.1, 238.2, 238.4, 238.5; 365/206, 207, 208, 183

[56] References Cited

U.S. PATENT DOCUMENTS

| | | | |
|---|---|---|---|
| 3,946,151 | 3/1976 | Kamiyama et al. | |
| 3,946,368 | 3/1976 | Chou | 365/183 |
| 4,060,737 | 11/1977 | Gosney | 365/183 X |
| 4,071,853 | 1/1978 | Yamanaka | 358/41 |
| 4,121,244 | 10/1978 | Nakabe et al. | 358/44 |
| 4,145,721 | 3/1979 | Beaudouin et al. | 358/213 |

FOREIGN PATENT DOCUMENTS 2059705  4/1981  United Kingdom ................ 365/206

OTHER PUBLICATIONS

White et al., "Characterization of Surface Channel CCD Image Arrays at Low Light Levels", IEEE J. Solid–State Circuits, Vol. SC-9, Feb. 1974, pp. 1–12.

Primary Examiner—Siegfried H. Grimm
Attorney, Agent, or Firm—Thomas H. Close

[57] ABSTRACT

Relatively noise-free information signals are recovered from a charge transfer device by demodulating sideband components of the output signal of the device at a selected harmonic of the pulse output frequency of the device. In a further refinement of the invention, the relative duty cycles between the clock signals employed to operate the device and the output signal from the device are chosen such that a minimum of power from the clock signals is present at the selected harmonic.

8 Claims, 20 Drawing Figures

FIG. 5a  $\phi_1$ 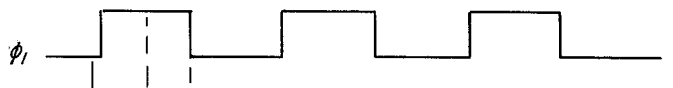
FIG. 5b  $\phi_2$ 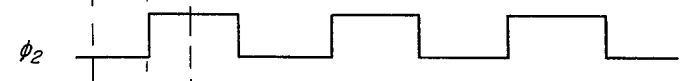
FIG. 5c  $\phi_3$ 
FIG. 5d  $\phi_4$ 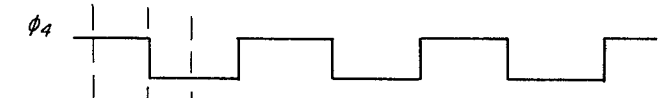
FIG. 5e  RESET 

$T_0$ $T_1$ $T_2$

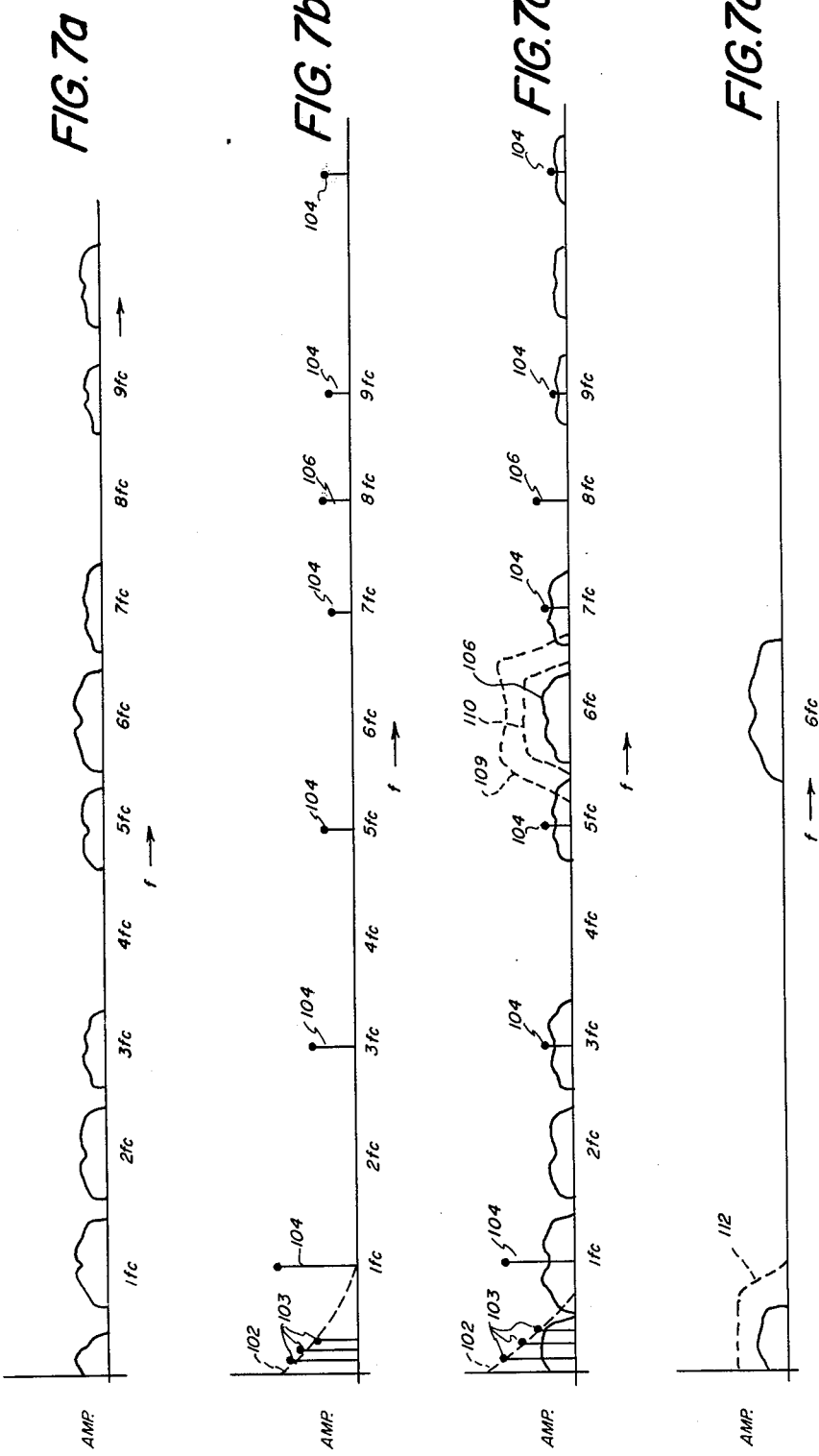

METHOD AND APPARATUS FOR RECOVERING A SIGNAL FROM A CHARGE TRANSFER DEVICE

BACKGROUND OF THE INVENTION

The present invention relates generally to signal recovery from charge transfer devices and more particularly to methods and apparatus for recovering such a signal in the presence of noise.

Description Related to the Problem

Charge transfer devices, e.g. bucket brigade devices (BBD's) and charge coupled devices (CCD's), have gained popularity in recent years for performing a wide variety of electronic functions including signal processing, image sensing, and temporary signal storage. For a more complete description of these devices, see "Charge Transfer Devices" by Sequin and Tompsett, Academic Press, Inc., 1975.

A CCD, for example, is comprised of an arrangement of metal-insulator-semiconductor (MIS) capacitors, whereby a charge packet, representing information, may be moved from one MIS capacitor to another. When an appropriate voltage is applied to the metal gate of one of the MIS capacitors, a potential well is formed under the gate in the semiconductor substrate. Charge can be stored in this potential well and can be physically moved to an adjacent MIS capacitor by manipulation of the voltages on the adjacent metal gates. A serial CCD shift register is formed by a linear array of MIS capacitors to which periodic voltage pulses, called clock signals, are applied so that a charge packet disposed under one electrode of the array is transported step-by-step to another location within the array. At one end of the array, the charge packet is sensed and converted by an output stage into an output signal that resembles one pulse in a pulse amplitude modulated signal. Such a shift register may be employed as a delay line in a signal processing circuit. If the voltages on respective gates of the linear array are held such that a series of potential wells, separated by potential hills, is formed and the array is illuminated, the shift register may be employed as a linear image sensing array. Where the array is exposed to light, a photon absorbed in the silicon substrate generates an electron hole pair, the majority carrier moves into the substrate and the minority carrier is collected in the nearest potential well. After a suitable exposure, the image sensor is operated as a shift register to move the charge packets thus produced to the output stage of the device.

A major problem involved with the operation of charge transfer devices results from the contamination of the output signal with clock feedthrough and several forms of noise. Clock feedthrough causes frequency components of the clock signals to appear in the output signal. Although, strictly speaking, clock feedthrough is not noise since it is a deterministic process, for present purposes, all sources of signal contamination including clock feedthrough will be referred to as noise. Other types of noise present in the output signal of a charge transfer device are so-called "1/f" noise characterized by an additive noise with high power at lower frequencies and lower power at high frequencies of a signal, and jitter from harmonics of the power supply voltage.

In the simplest signal recovery schemes of the prior art, the output signal is low-pass filtered with a filter having a cut-off frequency typically at about ½ the pulse repetition frequency to recover the baseband signal. In a practical implementation, however, such a technique fails to completely eliminate the unwanted harmonics of clock feedthrough and does nothing to suppress the noise occurring in the baseband of a signal.

Several schemes have been suggested for reducing or removing noise from the output signal produced by a charge transfer device (e.g. a CCD). These schemes involve some method for separately generating a "noise" signal that is similar and preferably identical to the noise present in the output signal from the device. The separately generated noise signal is then subtracted from the output signal of the device to yield a relatively noise-free output signal. One such approach employs a "dummy" device identical in most respects with the operational device except that the dummy device produces only noise and no signal. The dummy device and the operational device are clocked in synchronism and the output of the dummy device is subtracted from the output of the operational device by means of a differential amplifier. Unfortunately, it is very difficult to provide a dummy device that is an exact match with the operational device, and the area required for constructing such a dummy device in an integrated circuit is expensive in the use of semiconductor chip area.

Another approach, called "correlated double sampling" attempts to sample the signal produced by the output stage of the device just prior to, and again during, the readout of each charge packet. The sample taken prior to the readout of the charge packet is subtracted from the sample taken during readout of the charge packet to produce a relatively noise-free signal. The presence of relatively large amounts of clock feedthrough in most practical devices makes the sampling process in "correlated double sampling" extremely difficult.

Although several variations on the theme of separately detecting noise and subtracting it from the noisy signal are disclosed in the prior art, none so far has proven entirely satisfactory. The problem faced by the inventor, therefore, was to provide a new and improved method and apparatus for reducing noise in the output of a charge transfer device.

SOLUTION—SUMMARY OF THE INVENTION

The present invention provides a new method and apparatus for recovering relatively noise-free information signals from a charge transfer device and in doing so departs from the spirit of prior art schemes in that rather than attempting to subtract noise from a noisy signal in the time domain, noise is deftly side-stepped in the frequency domain, and the information signal reproduced relatively free of noise. To accomplish this, the information signal is recovered by demodulating sideband components of the signal at a selected harmonic of the pulse output frequency, thereby avoiding noise added into the baseband region of the signal spectrum. In a further refinement of the invention, the relative duty cycles between the clock signal and the output signal are chosen such that a minimum of power from the clock signals is present at the selected harmonic, thereby avoiding contamination of the information signal by clock feedthrough.

BRIEF DESCRIPTION OF THE DRAWINGS

The invention will be described with reference to the drawings, wherein:

FIGS. 5a-5e are waveform diagrams illustrating the clock signals and reset signal employed to operate the CCD shift register shown in FIG. 4;

FIG. 6b illustrates the effect of reset feedthrough on the signal waveform shown in FIG. 6a;

FIGS. 7a-7d are frequency spectrum diagrams useful in explaining the operation of the signal recovery apparatus shown in FIG. 4.

DESCRIPTION OF THE PREFERRED EMBODIMENTS

Figure 1:
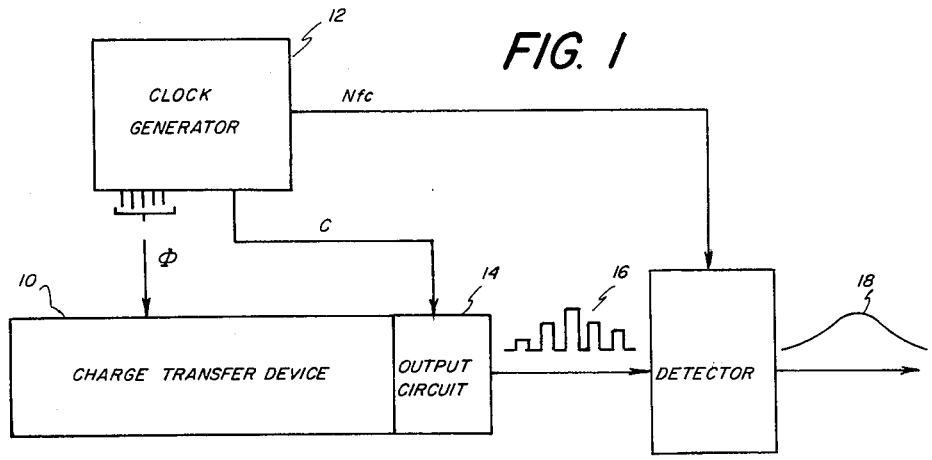
FIG. 1 is a simplified block diagram illustrating a charge transfer device in combination with signal recovery apparatus according to the present invention.
Figure 2A:
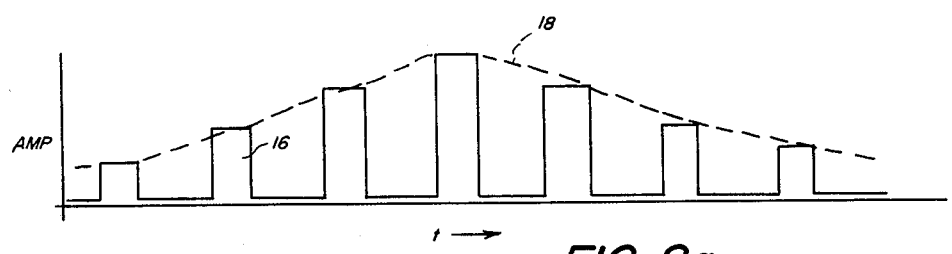
FIG. 2a shows an idealized noise-free pulse amplitude modulated waveform of the type produced by a charge transfer device.

Referring to FIG. 1, a simplified overview of signal recovery apparatus according to the present invention is shown. A charge transfer device 10, such as a CCD or BBD shift register, receives periodic clock signals $\Phi$ from a clock circuit 12 in a known manner to shift a serial train or charge packets to an output circuit 14. The output circuit 14 comprises, for example, an integrated floating gate amplifier for converting the serial train of charge packets to a signal resembling a pulse amplitude modulated waveform. A control signal C for the output circuit 14 is supplied by clock circuit 12. An idealized, noise-free pulse amplitude modulated waveform 16, representative of the signal produced by output circuit 14, is shown in FIG. 2a. A baseband signal 18 represented by the samples in the pulse amplitude modulated waveform is shown by a dotted line 18 in FIG. 2a. The baseband signal comprises, for example, a TV or radio signal introduced into the charge transfer device, or a pattern of illumination incident on the charge transfer device if the charge transfer device is configured and operated as an image sensor.

In operation, the actual waveform produced by the output circuit 14 is far from the crisp and clean waveform shown in FIG. 2a, but is infested with square waves and spikes from clock feedthrough and is polluted with several kinds of noise, including "1/f" noise and power supply jitter that are added to the signal in the charge transfer device and in the output circuit 14. A more realistic picture of the output signal is shown by the noisy signal 17 shown in FIG. 2b.

Figure 3A:
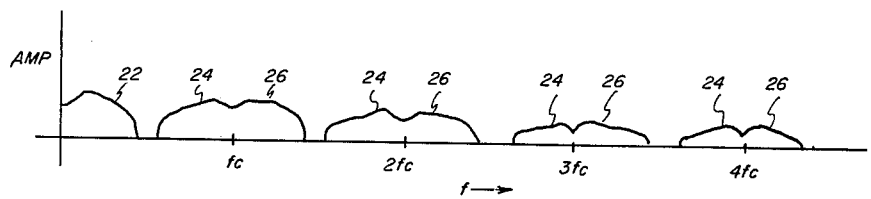
FIGS. 3a-3d are frequency spectrum diagrams useful in describing the operation of the signal recovery apparatus according to the present invention.

FIG. 3a illustrates the frequency spectrum of a pulse amplitude modulated signal such as the noise-free output signal 16 illustrated in FIG. 2a. The frequency spectrum comprises a baseband component 22 representing the baseband signal 18, and a series of lower and upper sideband components 24 and 26, respectively, disposed about the harmonics of the pulse repetition frequency $f_c$.

Figure 2B:
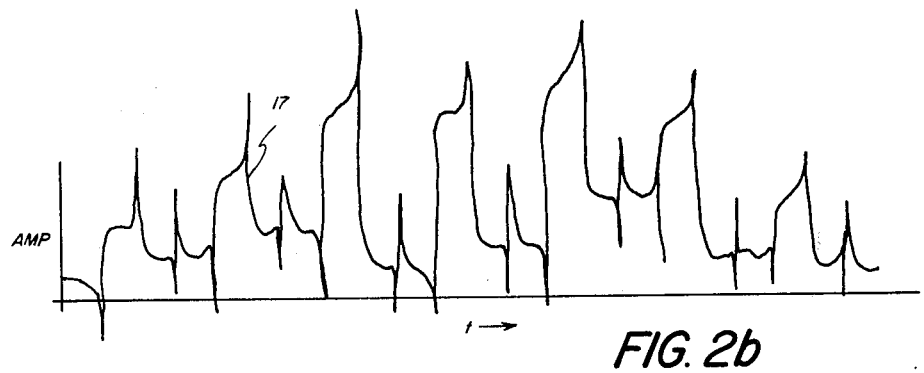
FIG. 2b shows a more realistic waveform of the type shown in FIG. 2a infested with several types of noise.
Figure 3B:
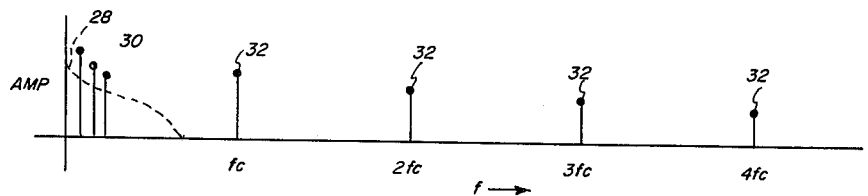
Figure 3C:
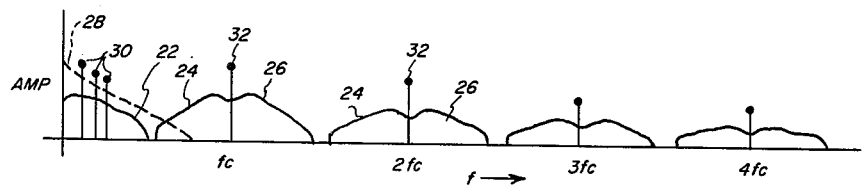

FIG. 3b illustrates the frequency spectrum of several kinds of noise that are added to the noise-free signal 16 to result in the noisy signal 17 as shown in FIG. 2b. The noise spectrum comprises a "1/f" component 28 with relatively high power at lower frequencies and lower power at high frequencies. Power supply jitter produces spikes 30 at harmonics of the 60-cycle power supply frequency, and clock feedthrough produces spikes 32 at harmonics of the clock frequency $f_c$. The frequency spectrum of the noisy signal is the sum of the spectra shown in FIGS. 3a and 3b and is shown in FIG. 3c. Returning to FIG. 3a, it is seen that the configuration of the spectrum at each harmonic of the pulse repetition frequency $f_c$ has the appearance of a double-sideband suppressed-carrier signal which can be demodulated according to known techniques, e.g. synchronous detection, to recover the baseband signal 18.

It is the function of the signal recovery apparatus according to the present invention to recover a relatively noise-free baseband signal 18 from the noisy output signal. Referring now to FIG. 1, the baseband signal is recovered according to the invention by demodulating sideband components of the signal, for example, with a synchronous detector 20 supplied with a reference signal $NF_c$ from clock 12. The detector receives the noisy output signal from the output circuit 14 and demodulates one of the sets of sideband components disposed about a harmonic of the pulse repetition frequency $f_c$, thereby avoiding noise present in the output signal near the baseband frequencies.

For example, when the second harmonic $2f_c$ is chosen, the detector is supplied with a reference signal generated by clock 12 at the same frequency and in phase with the second harmonic of the pulse repetition frequency. In this case, were sufficient clock feedthrough of the right phase to be present, the clock feedthrough itself would act as a carrier, and the signal would be demodulated like a double side band, large-carrier AM waveform by a simple diode detector.

Figure 3D:
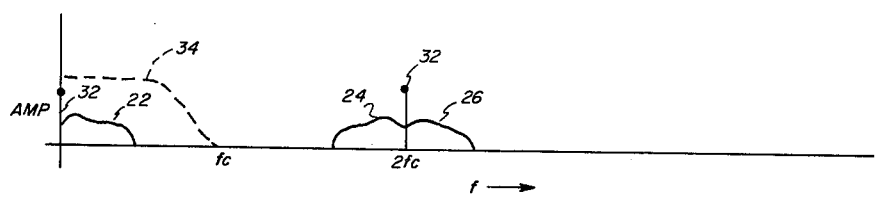

The spectrum of the signal produced by detector 20 is shown in FIG. 3d. Note that the baseband 22 that has been recovered from the sideband components of the second harmonic is now essentially free from noise, with the exception of some clock feedthrough 32. The baseband signal 18 is recovered by filtering the output of the detector 20 with a low pass filter having the characteristic shown by dotted lines 34 in FIG. 3d. The component of clock feedthrough 32 recovered with the baseband signal has the effect of a DC bias and is removed by well-known clamping techniques.

According to another feature of the present invention, any component of clock feedthrough remaining in the recovered signal is avoided by proper selection of the relative duty factors of the clock signals and the output signal. The clock signals and the output signal all have waveforms resembling square waves. According to Fourier analysis, the $n^{th}$ Fourier coefficient for a square wave is $$C_n = \frac{e^{\frac{-i2\pi n\Delta}{T_o}}\left[1 - e^{\frac{-i2\pi nT}{T_o}}\right]}{i2\pi n} \quad (1)$$

where T is the width of a pulse in the wave train, $T_o$ is the period of the wave train, and $\Delta$ is the phase delay from the start of a period to the leading edge of a pulse. $T/T_o$ is called the duty factor of the square wave.

The first exponential on the right hand side of equation 1 is a phase term which contains the information about the position of the pulse in the overall period. The denominator produces a fixed phase shift ($-90°$) and a magnitude roll-off in proportion to n. The quantity within parenthesis affects both magnitude and phase. When the quantity $2\pi nT/T_o$ is an even integral multiple of $\pi$, this factor is 0 in magnitude. When $2\pi nT/T_o$ is an odd integral of multiple $\pi$, this factor has a magnitude near 2 and a phase angle near 0. Values of the exponent which are not near an integral multiple of $\pi$ yield magnitudes between 0 and 2, with non-zero phase angles.

Since all the clock waveforms used to operate the charge transfer device have the same general form, all components of clock feedthrough in the output signal will have Fourier series coefficients that are multiples (perhaps complex) of coeffients defined by equation 1. No energy can be introduced into the output signal at other frequencies except by performing some non-linear operation such as clipping. Thus, if the relative duty factors of the clock signals and the output signal are adjusted so that at the selected harmonic for demodulating the signal, Fourier coefficients of the clock signals are equal to zero, no clock feedthrough will appear in the baseband of the demodulated signal. It is also desirable to adjust the relative duty factors so that the magnitude of the Fourier coefficient of the signal is maximized at the selected harmonic. In general, if $2n$ times the clock signal duty factor is equal to an even interger, and $2n$ times the output signal duty factor is equal to an odd integer, where n is the number of the selected harmonic, clock feedthrough will be avoided in the signal recovered according to the present invention.

Figure 4:
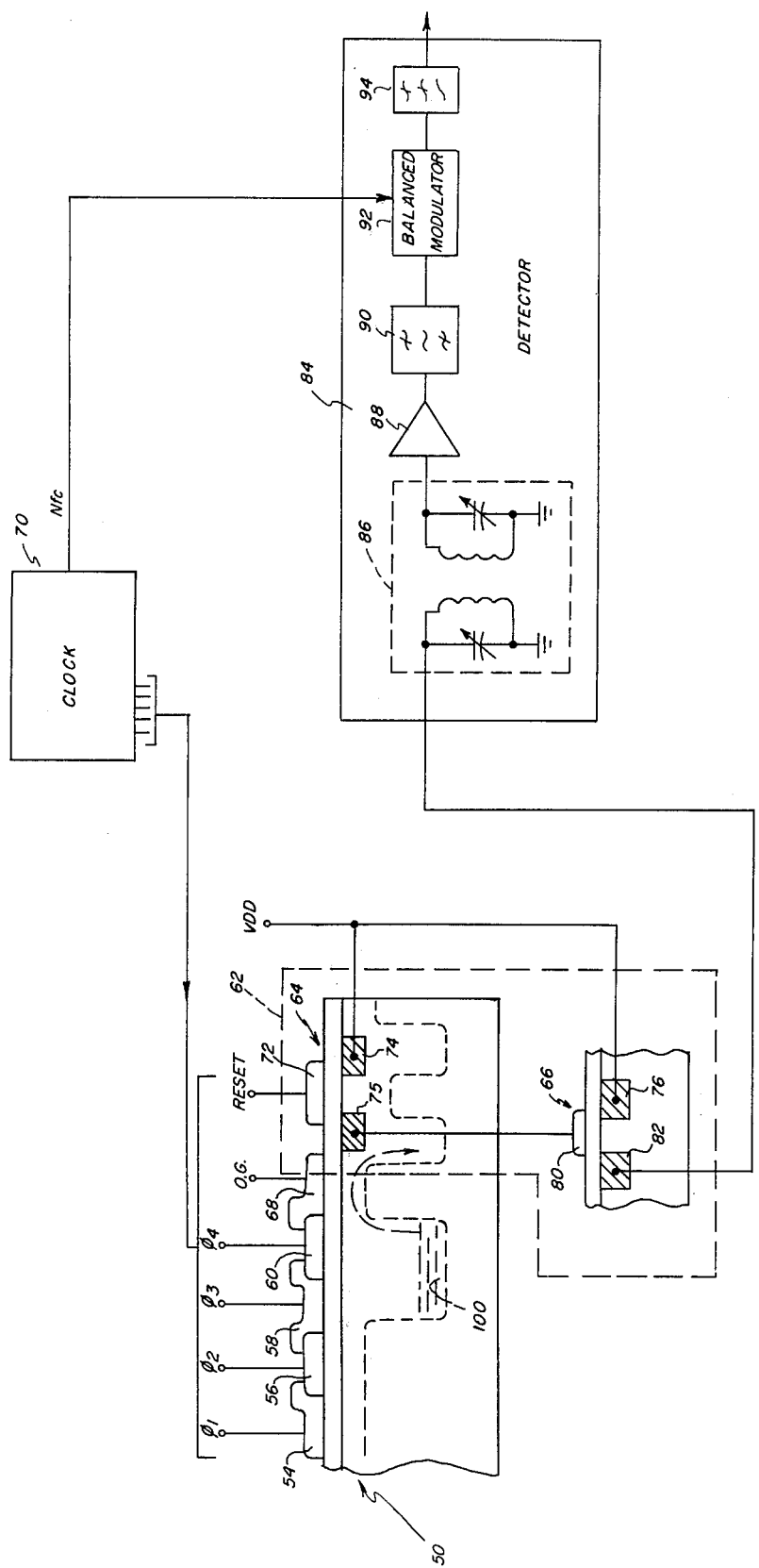
FIG. 4 is a block diagram showing a preferred implementation of the present invention in combination with a CCD shift register.

Referring now to FIG. 4, an example of the presently preferred embodiment of the invention will be described. The charge transfer device that generates the signal is a CCD image sensing array of which a portion of a four-phase output shift register, generally designated 50, is shown. The portion of the shift register shown includes one four-phase charge transfer cell comprising four electrodes 54, 56, 58 and 60 and an output circuit 62 comprising two FETs 64 and 66. An output gate 68 separates by a potential barrier the fourth phase of the transfer cell 52 from the FET 64 of output circuit 62. A clock generator circuit 70 supplies the four-phase clock signals $\Phi$ to the CCD transfer cells and a reset signal to a gate 72 of FET 64. A reference voltage VDD is supplied to sources 74 and 76 of FET 64 and 66, respectively. A drain 75 of FET 64 is connected to a gate 80 of FET 66. The output signal appears on the drain 82 of FET 66 and is supplied to a detector circuit 84. The detector circuit 84 includes an IF transformer 86, a video amplifier 88, a bandpass filter 90, a balanced modulator 92, and a low pass filter 94. A carrier signal $Nf_c$ is supplied to the balanced modulator 92 from the clock circuit 70.

Figure 6A:
FIG. 6a is an idealized waveform showing the output of the CCD shift register in the absence of noise.

FIGS. 5a through 5d show the four-phase clock waveforms generated by clock 70 and applied to the four-phase transfer electrodes 54 through 60 of the CCD shift register to shift a serial train of charge packets to the output circuit 62. The clock waveforms are developed by counting the pulses from a master clock (not shown) in the clock generating circuit 70 in a well known manner. The master clock operates at a frequency eight times the frequency of the individual clock waveforms. A reset signal (see FIG. 5e) similar to the phase three signal $\Phi_3$ shown in FIG. 5c is also supplied by the clock circuit 70 to the gate 72 of FET 64 in the output circuit 62. As shown in FIGS. 5a through 5e, the reset signal and the clock signal waveforms all have 50% duty factors. FIG. 6a is an idealized waveform showing the output signal produced by output circuit 62. The output signal is produced in the following manner. At time $T_o$ (see FIGS. 5a–6c) a charge packet 100 (see FIG. 4) resides under the phase 3 and phase 4 transfer gates 58 and 60. The reset pulse sets the potential of the floating output diffusion 75 to the potential of the reset drain 74. At time $T_1$ the potential well under the phase 4 electrode 60 is collapsed and the charge packet 100 is dumped over the fixed potential barrier provided by output gate 68 onto the floating output diffusion 75. Since the floating output diffusion 75 is connected to the gate of FET 66, FET 66 conducts in proportion to the size of the charge packet 100 thereby causing the output voltage on drain 82 of FET 66 to go to the signal level. At time $T_2$, the reset pulse is again applied to the reset gate 72 thereby returning the output voltage to the reset level in preparation for the next pulse readout. The time relation between the phase 4 clock signal and the reset signal is chosen so that the duty factor of the output signal is 25% as shown in FIG. 6a.

Figure 6B:

Parasitic capacitance between the reset gate 72 and the floating diffusion 75 results in breakthrough of the reset signal onto the floating gate diffusion, which is in turn reflected as a square wave added to the output signal via output FET 66 as shown in FIG. 6b. In addition to the reset signal breakthrough—clock feedthrough, power supply jitter and "1/f" noises originating in the channel of output FET 66 are present in the output signal. As a result, the output signal actually appears more like the signal shown in FIG. 6c than the idealized waveform shown in FIG. 6a.

Figure 6C:
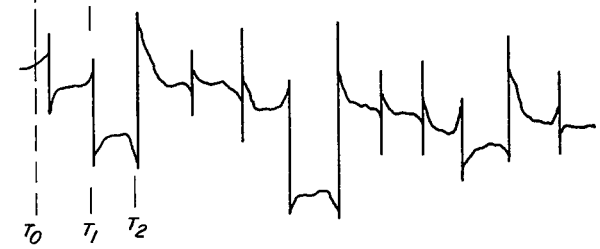

The frequency spectrum of the idealized output signal (6a) is shown in FIG. 7a. Since the duty factor of the output signal is 25%, there are no sidebands at multiples of four times the pulse repetition frequency $f_c$. The frequency spectrum of the noise added to the output signal shown in FIG. 6c is shown in FIG. 7b. The noise shown includes "1/f" noise 102, power supply jitter 103; clock and reset feedthrough 104 and feedthrough 106 from the master clock. Since the duty factors of the clock and reset signals are 50%, there is no clock feedthrough power at the even harmonics of the pulse repetition frequency $f_c$, except at the harmonics of the master clock frequency $8f_c$. FIG. 7c shows the frequency spectrum of the output signal combined with the noise. Note that at $6f_c$ there exists a sideband component 107 that is free of noise. It is this sideband component that is selected to be demodulated by the signal recovery circuit 84.

Referring to FIG. 4, the IF transformer 86 has a pass band characteristic indicated by the dotted line 109 in FIG. 7c. This portion of the signal is amplified by video amplifier 88 and further filtered by bandpass filter 90 having the pass band characteristics indicated by dotted line 110 in FIG. 7c. The resulting sideband components, thus separated from the signal, are multiplied by a reference signal, having a frequency $6f_c$ supplied from clock 70, in balanced modulator 92. The resulting signal is shown in FIG. 7d. The output of the balanced modulator 92 is further filtered by low pass filter 94, having the filter characteristics shown by dotted lines 112 in FIG. 7d, to recover the baseband signal relatively free of noise. As was noted earlier, the CCD shift register 50 is the output shift register of a CCD imaging device. The imaging device is operated at 7MHz pulse repetition frequency, and hence the reference signal frequency used for demodulating the baseband signal, is 42 MHz. The clocking scheme yielding a noise free sixth harmonic was selected because 42 MHz lies in the intermediate frequency range used in standard television receivers and apparatus for demodulating television signals is well known and generally available. Consequently, detector 84 (see FIG. 4) may comprise an IF strip of the type commonly employed in home television receivers.

The invention has been described with particular reference to preferred embodiments thereof, but it is to be understood that changes and modifications may be effected within the spirit and scope of the invention. For example, in the preferred embodiment described above, the reset signal duty factor was the same as for the other clock signals. Alternatively, the reset signal duty factor may differ from the duty factors of the other clock signals as long as 2n times the duty factor of the reset signal is an even integer, again where n is the selected harmonic from which the signal is recovered. One possible arrangement would be the following:

Clock duty factor: $\frac{1}{2}$
Reset signal duty factor: $\frac{1}{4}$
Output signal duty factor: $\frac{3}{8}$ or $\frac{5}{8}$ Resulting in useful harmonics at n=4, 12, 20 ... (4+8k) where k is an integer.

I claim:

1. Apparatus for recovering a baseband signal from the output signal produced by a charge transfer device, said charge transfer device being driven by periodic clock signals, to move a serial train of charge packets, representing periodic samples of a baseband signal, to an output location, and including output circuit means for sensing said serial train of charge packets at said output location and producing in response thereto a pulse amplitude modulated signal having a pulse repetition frequency $f_c$, said pulse amplitude modulated signal comprising a baseband component and a series of sideband components disposed about harmonics of the pulse repetition frequency of said output signal, said signal recovery apparatus comprising:

means connected to said output circuit means to receive said output signal for demodulating the sideband components of said output said signal disposed about a selected frequency $Nf_c$, where N is an integer, to produce a detected signal having a baseband component representing the baseband component of said output signal and a series of sideband components; and low pass filter means connected to said demodulating means to receive said detected signal for passing only said baseband component of said detected signal.

2. The invention claimed in claim 1 wherein the relative duty factors of said periodic clock signals and said output signal are selected such that there exists a frequency $Xf_c$, X being an integer, where the power from said clock signals is negligible, said frequency $Xf_c$ being said selected frequency $Nf_c$, thereby avoiding contamination of the recovered baseband component of said detected signal by clock feedthrough.

3. The invention claimed in claim 2 wherein said periodic clock signals include a reset signal having a duty factor different from said other clock signals, and wherein at said selected frequency, the power from said reset signal is negligible, thereby avoiding contamination of the recovered baseband component of said detected signal by reset signal feedthrough.

4. The invention claimed in claim 2 wherein said periodic clock signals are developed from a master clock having a frequency that is an integral multiple of the frequency of said clock signals, and wherein at said selected frequency the power from said master clock frequency is negligible, thereby avoiding contamination of said recovered baseband component of said detected signal by master clock feedthrough.

5. A method for recovering a baseband signal from the output signal produced by a charge transfer device, said charge transfer device being driven by periodic clock signals, to move a serial train of charge packets, representing periodic samples of said baseband signal, to an output location, and including output circuit means for sensing said serial train of charge packets at said output location and producing in response thereto a pulse amplitude modulated signal, said pulse amplitude modulated signal having a pulse repetition frequency $f_c$ and comprising a baseband component and series of upper and lower sideband components disposed about harmonics of the pulse repetition frequency, said signal recovery method comprising the steps of:

demodulating the sideband components disposed about a selected frequency $Nf_c$, where N is an integer, to produce a detected signal having a baseband component representing the baseband component of said output signal and a series of sideband components; and low pass filtering said detected signal to remove said sideband components and recover said baseband component of said detected signal.

6. The invention claimed in claim 5 wherein said periodic clock signals and said output signal are such that there exists a frequency $Xf_c$ (where X is an integer) where the power of said clock signals is negligible and said signal recovery method further comprises using said frequency $Xf_c$ as said selected frequency $Nf_c$ in said demodulating step.

7. The invention claimed in claim 6 wherein said periodic clock signals include a reset signal having a duty factor different from said other clock signals and said frequency $Xf_c$ is such that the power from said reset signal is negligible at said selected frequency.

8. The invention claimed in claim 7 wherein said periodic clock signals are developed from a master clock having a frequency that is an integral multiple of the frequency of said clock signals, and said demodulating step including using a frequency $Nf_c$ such that the power from said master clock frequency is negligible at said frequency $Nf_c$.

* * * * *